US010333530B1

(12) United States Patent
Katsuragi (10) Patent No.: US 10,333,530 B1
(45) Date of Patent: Jun. 25, 2019

(54) VOLTAGE-CONTROLLED OSCILLATOR AND PHASE LOCKED LOOP HAVING VOLTAGE-CONTROLLED OSCILLATOR

(71) Applicant: TOSHIBA MEMORY CORPORATION, Minato-ku, Tokyo (JP)

(72) Inventor: Makihiko Katsuragi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/055,505

(22) Filed: Aug. 6, 2018

(30) Foreign Application Priority Data

Mar. 20, 2018 (JP) ................................ 2018-052992

(51) Int. Cl.
*H03L 7/099* (2006.01)
*H03L 7/097* (2006.01)
*H03L 1/00* (2006.01)
*H03L 7/08* (2006.01)

(52) U.S. Cl.
CPC .............. *H03L 7/097* (2013.01); *H03L 1/00* (2013.01); *H03L 7/0805* (2013.01); *H03L 7/0995* (2013.01)

(58) Field of Classification Search
CPC ...... H03L 9/099; H03L 9/0991; H03L 9/0992
See application file for complete search history.

(56) References Cited

U.S. PATENT DOCUMENTS

| 7,030,688 | B2 * | 4/2006 | Dosho | H03L 7/0812 |
| | | | | 327/157 |
| 7,659,782 | B2 * | 2/2010 | Cong | H03L 7/093 |
| | | | | 331/16 |
| 8,253,498 | B2 | 8/2012 | Yagishita et al. | |
| 8,446,139 | B2 | 5/2013 | Tsukuda | |
| 8,564,340 | B2 * | 10/2013 | Liu | H03L 7/093 |
| | | | | 327/147 |
| 8,638,140 | B2 * | 1/2014 | Okada | H03L 7/0805 |
| | | | | 327/147 |

FOREIGN PATENT DOCUMENTS

JP 4991385 B2 8/2012

* cited by examiner

*Primary Examiner* — Hai L Nguyen
(74) *Attorney, Agent, or Firm* — Foley & Lardner LLP (57) ABSTRACT

According to one embodiment, a voltage-controlled oscillator includes a voltage-current conversion circuit and hold circuit that outputs a first current corresponding to a control voltage, a current addition circuit that outputs a second current corresponding to the first current, and a current subtraction circuit that outputs a third current corresponding to the first current. The voltage-controlled oscillator also includes a narrow-band low-pass filter that passes a current in a first frequency band to reduce noise of the second current, a voltage-current converter that outputs a sixth current corresponding to a fifth current obtained by subtracting the third current from a fourth current corresponding to the control voltage, and a low-pass filter that passes a current in a second frequency band to reduce noise of the sixth current. The second frequency band is different from the first frequency band. The voltage-controlled oscillator further includes a current-controlled oscillator that oscillates a clock signal in accordance with a combined current of the second current and the sixth current.

20 Claims, 7 Drawing Sheets

VOLTAGE-CONTROLLED OSCILLATOR AND PHASE LOCKED LOOP HAVING VOLTAGE-CONTROLLED OSCILLATOR

CROSS-REFERENCE TO RELATED APPLICATION

This application is based upon and claims the benefit of priority from Japanese Patent Application No. 2018-052992, filed Mar. 20, 2018, the entire contents of which are incorporated herein by reference.

FIELD

Embodiments described herein relate generally to a voltage-controlled oscillator and a phase locked loop having the voltage-controlled oscillator.

BACKGROUND

A phase locked loop (PLL) that generates a clock signal is publicly known. The phase locked loop includes a voltage-controlled oscillator, for example.

Examples of related art include JP-A-2011-078054.

DETAILED DESCRIPTION

Embodiments provide a voltage-controlled oscillator or a phase locked loop, which outputs a stable clock signal.

In general, according to one embodiment, a voltage-controlled oscillator includes a current source that outputs a first current corresponding to a first voltage, a first circuit that outputs a second current corresponding to the first current, and a second circuit that outputs a third current corresponding to the first current. The voltage-controlled oscillator also includes a first filter that passes a current in a first frequency band to reduce noise of the second current, a voltage-current converter that outputs a sixth current corresponding to a fifth current which is obtained by subtracting the third current from a fourth current corresponding to the first voltage, and a second filter that passes a current in a second frequency band to reduce noise of the sixth current. The second frequency band is different from the first frequency band. The voltage-controlled oscillator further includes a current-controlled oscillator that oscillates a clock signal in accordance with a combined current of the second current and the sixth current.

Hereinafter, embodiments of the present disclosure will be described with reference to the drawings. In the following descriptions, components having the same function and the same configuration are indicated by the same reference signs. Each of the embodiments described below exemplifies a device and a method for implementing the technical concept of the respective embodiment and is not intended to limit material, shape, configuration, layout, and other factors of the components to the following examples.

Each functional block may be implemented by hardware, computer software, or a combination of hardware and computer software. It is not essential that each functional block is separated from one another as described below. For example, some functions may be executed by a functional block that is different from the exemplified functional block. Moreover, the exemplified functional block may be divided into still smaller functional subblocks.

The voltage-controlled oscillator in each of the first to the third embodiments described below is, for example, used in a phase locked loop. First, a configuration of a phase locked loop having a voltage-controlled oscillator of an embodiment is described.

[Phase Locked Loop (PLL)]

Figure 1:
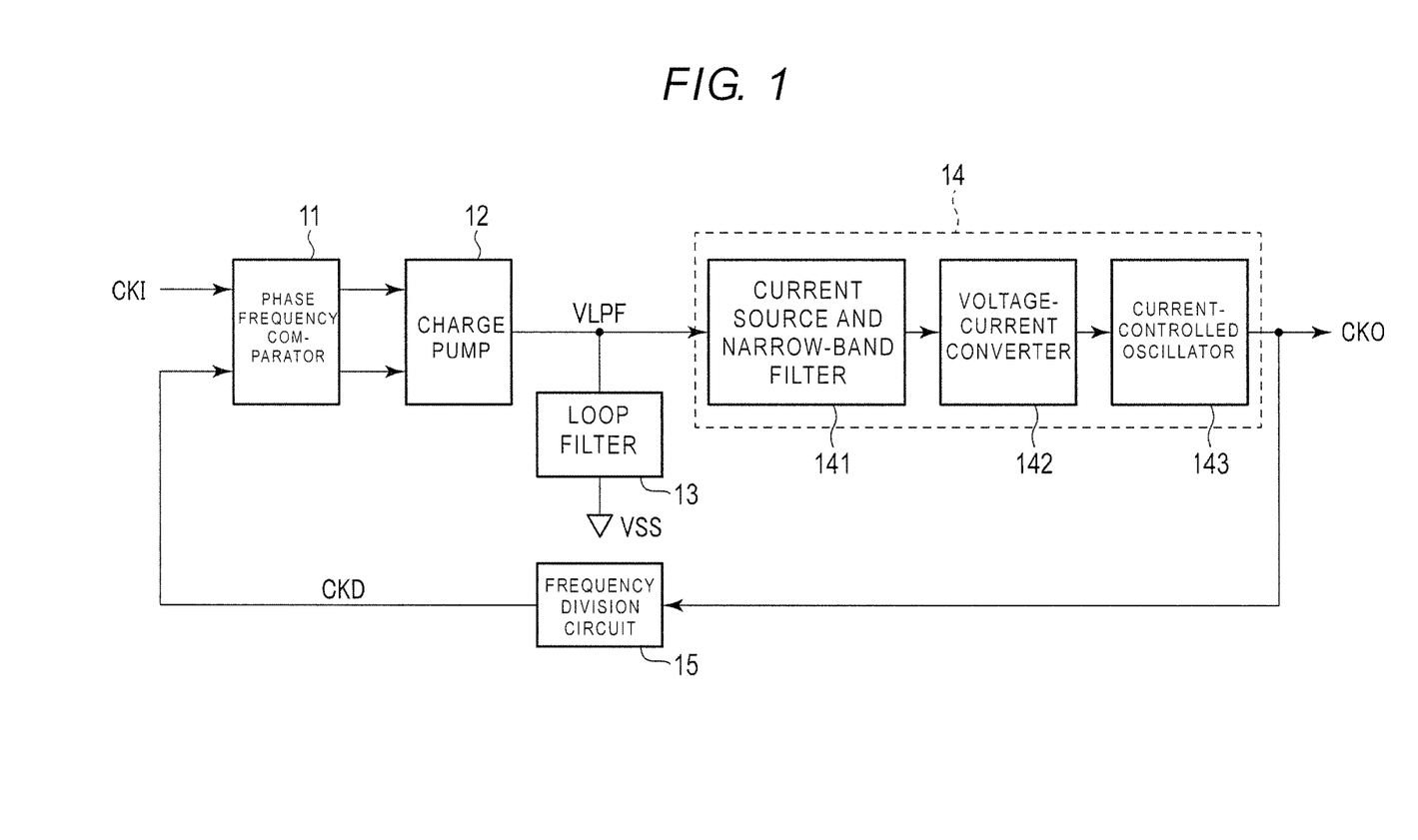
FIG. 1 is a block diagram illustrating a configuration of a phase locked loop having a voltage-controlled oscillator of an embodiment.

FIG. 1 is a block diagram illustrating a configuration of a phase locked loop having a voltage-controlled oscillator of an embodiment. The phase locked loop includes a phase frequency comparator 11, a charge pump 12, a loop filter 13, a voltage-controlled oscillator (VCO) 14, and a frequency division circuit 15.

The phase frequency comparator 11 compares an input reference clock signal CKI and a clock signal CKD to detect a phase difference or a frequency difference. The clock signal CKD is a signal that is output from the voltage-controlled oscillator 14 and is then divided by the frequency division circuit 15.

The charge pump 12 outputs a current pulse in accordance with the result of the comparison by the phase frequency comparator 11 and supplies a control voltage VLPF corresponding to the current pulse, to the voltage-controlled oscillator 14. The loop filter 13 reduces noise of the control voltage VLPF or the current pulse supplied from the charge pump 12.

The voltage-controlled oscillator 14 has a current source and narrow-band filter 141, a voltage-current converter (VIC) 142, and a current-controlled oscillator (ICO) 143. The voltage-controlled oscillator 14 outputs a clock signal CKO having a frequency corresponding to the control voltage VLPF. Details of the voltage-controlled oscillator 14 are described later.

The frequency division circuit 15 divides the clock signal CKO and thereby outputs the clock signal CKD.

[1] First Embodiment

Next, the voltage-controlled oscillator 14 of the first embodiment is described with reference to FIG. 2.

[1-1] Configuration of Voltage-Controlled Oscillator

Figure 2:
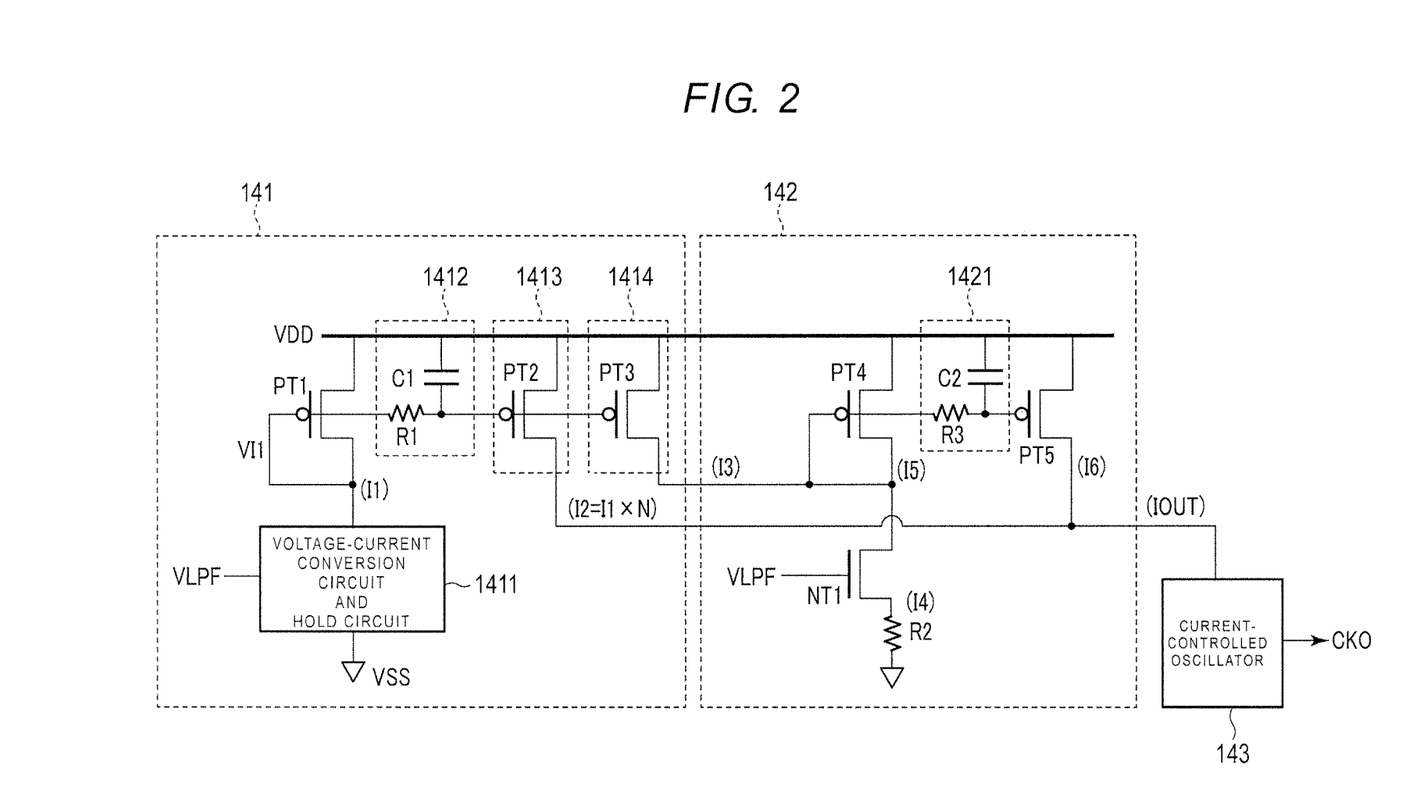
FIG. 2 is a circuit diagram illustrating a configuration of a voltage-controlled oscillator of a first embodiment.

FIG. 2 is a circuit diagram illustrating a configuration of the voltage-controlled oscillator of the first embodiment. As described above, the voltage-controlled oscillator 14 includes the current source and narrow-band filter 141, the voltage-current converter 142, and the current-controlled oscillator 143.

The current source and narrow-band filter 141 includes a voltage-current conversion circuit and hold circuit 1411, a narrow-band low-pass filter 1412, a current addition circuit 1413, a current subtraction circuit 1414, and a p-channel MOS transistor (hereinafter called a "pMOS transistor") PT1.

The narrow-band low-pass filter 1412 includes a resistor R1 and a capacitor C1. The current addition circuit 1413 includes a pMOS transistor PT2, and the current subtraction circuit 1414 includes a pMOS transistor PT3. The pMOS transistor PT1, the pMOS transistor PT2, and the pMOS transistor PT3 constitute a current mirror circuit.

The voltage-current converter 142 includes an n-channel MOS transistor (hereinafter called an "nMOS transistor") NT1, pMOS transistors PT4 and PT5, a resistor R2, and a low-pass filter 1421. The pMOS transistors PT4 and PT5 constitute a current mirror circuit. The low-pass filter 1421 includes a resistor R3 and a capacitor C2.

The following describes connection relationships in the voltage-controlled oscillator 14 illustrated in FIG. 2.

The control voltage VLPF is supplied to an input terminal of the voltage-current conversion circuit and hold circuit 1411. A current input terminal of the voltage-current conversion circuit and hold circuit 1411 is connected to gate and drain of the pMOS transistor PT1 and a terminal of the resistor R1. The other terminal of the resistor R1 is connected to a first electrode of the capacitor C1 and gates of the pMOS transistors PT2 and PT3. Sources of the pMOS transistors PT1, PT2, and PT3 and a second electrode of the capacitor C1 are connected to a power supply voltage terminal VDD. A current output terminal of the voltage-current conversion circuit and hold circuit 1411 is connected to a reference voltage terminal VSS, for example, ground voltage.

A drain of the pMOS transistor PT2 is connected to an input terminal of the current-controlled oscillator 143. A drain of the pMOS transistor PT3 is connected to gate and drain of the pMOS transistor PT4, a terminal of the resistor R3, and a drain of the nMOS transistor NT1. The other terminal of the resistor R3 is connected to a first electrode of the capacitor C2 and a gate of the pMOS transistor PT5. A drain of the pMOS transistor PT5 is connected to the input terminal of the current-controlled oscillator 143. Sources of the pMOS transistors PT4 and PT5 and a second electrode of the capacitor C2 are connected to the power supply voltage terminal VDD. A gate of the nMOS transistor NT1 is supplied with the control voltage VLPF. A source of the nMOS transistor NT1 is connected to the reference voltage terminal VSS via the resistor R2.

[1-2] Operation of Voltage-Controlled Oscillator and Phase Locked Loop

Figure 3:
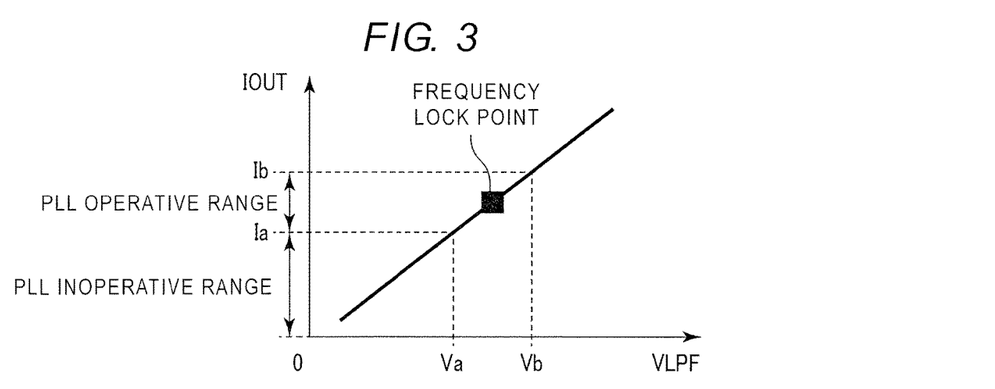
FIG. 3 is a diagram illustrating input-output characteristics of a voltage-current converter provided in the voltage-controlled oscillator of the first embodiment.

First, outline of operation of the voltage-controlled oscillator 14 is described. FIG. 3 is a diagram illustrating input-output characteristics of the voltage-current converter 142 provided in the voltage-controlled oscillator 14. The horizontal axis represents the control voltage VLPF that is input to the voltage-current converter 142, and the vertical axis represents a current IOUT that is output from the voltage-current converter 142.

As illustrated in FIG. 3, the current IOUT increases as the control voltage VLPF increases. The range in which the control voltage VLPF is lower than a voltage Va corresponds to a current range of 0 to Ia in which the PLL does not operate. The range in which the control voltage VLPF is a voltage of Va to Vb corresponds to a current range of Ia to Ib in which the PLL operates. In the current range of 0 to Ia, the current IOUT is supplied as a fixed current Ia. The approximately middle point in the current range of Ia to Ib is a lock point at which the current-controlled oscillator 143 sets the frequency of the clock signal CKO.

In this embodiment, the fixed current Ia is generated by the current addition circuit 1413 in the current source and narrow-band filter 141, and the current (Ia to Ib) in the PLL operative range is generated by the voltage-current converter 142 and the current subtraction circuit 1414. That is, the current addition circuit 1413 in the current source and narrow-band filter 141 outputs the fixed current Ia, and the voltage-current converter 142 and the current subtraction circuit 1414 output a current in the operative range by subtracting the fixed current Ia from the current Ib.

Noise of the fixed current Ia is reduced by the narrow-band low-pass filter 1412. Noise of the current in the operative range is reduced by the low-pass filter 1421. The narrow-band low-pass filter 1412 passes only a signal in a frequency band that is lower than the pass frequency band of the low-pass filter 1421. That is, the narrow-band low-pass filter 1412 has narrow band passage characteristics compared with the passage characteristics of the low-pass filter 1421. Thus, the noise of the fixed current Ia is reduced, and noise of the current IOUT that is output from the voltage-current converter 142 is also reduced. As a result, in accordance with the current IOUT, the current-controlled oscillator 143 outputs a clock signal CKO having a stable frequency.

Next, operation of the phase locked loop and the voltage-controlled oscillator 14 is described with reference to FIGS. 1 and 2. It is noted that the fixed current Ia is described as "fixed current I2" hereinafter.

As illustrated in FIG. 1, a reference clock signal CKI is input to the phase frequency comparator 11. The phase frequency comparator 11 compares the input reference clock signal CKI and a clock signal CKD that is a result of division by the frequency division circuit 15, to detect a phase difference or a frequency difference. The phase frequency comparator 11 outputs the result of detecting the phase difference to the charge pump 12.

The charge pump 12 outputs a current pulse corresponding to the received phase difference and supplies a control voltage VLPF corresponding to the current pulse to the voltage-controlled oscillator 14. At this time, noise of the control voltage VLPF is reduced by the loop filter 13.

As illustrated in FIG. 2, the voltage-current conversion circuit and hold circuit 1411 converts the control voltage VLPF that is received from the charge pump 12, into a current I1 accordingly and holds the current I1. That is, the current I1 flows in the voltage-current conversion circuit and hold circuit 1411, whereby a voltage VI1 corresponding to the current I1 is supplied to each of the gates of the pMOS transistors PT1, PT2, and PT3. The narrow-band low-pass filter 1412 reduces the noise of the current I1 or the voltage VI1 supplied to the gates of the pMOS transistors PT2 and PT3.

The narrow-band low-pass filter 1412 passes a signal in a first frequency band, and the low-pass filter 1421 passes a signal in a second frequency band that is different from the first frequency band. The first frequency band of the narrow-band low-pass filter 1412 is lower or narrower than the second frequency band of the low-pass filter 1421. Thus, the narrow-band low-pass filter 1412 cuts off a signal having a frequency higher than the frequency in the first frequency band, which passes the low-pass filter 1421. In other words, the narrow-band low-pass filter 1412 passes a signal having a frequency lower than a first cutoff frequency in the first frequency band and cuts off a signal having a frequency at the first cutoff frequency or higher. The low-pass filter 1421 passes a signal having a frequency lower than a second cutoff frequency in the second frequency band and cuts off a signal having a frequency at the second cutoff frequency or higher. The second cutoff frequency of the low-pass filter 1421 is higher than the first cutoff frequency of the narrow-band low-pass filter 1412.

The pMOS transistors PT1 and PT2 constitute a current mirror circuit. Thus, in accordance with the size ratio of the transistor PT2 to the transistor PT1, a fixed current I2 is output from the drain of the transistor PT2 to the current-controlled oscillator 143 via the voltage-current converter 142. Assuming that the size ratio of the transistor PT2 to the transistor PT1 is represented by "N", the current I2 is "I1×N".

The pMOS transistors PT1 and PT3 also constitute a current mirror circuit. Thus, in accordance with the size ratio of the transistor PT3 to the transistor PT1, a current I3 is supplied from the drain of the transistor PT3 to the drain of the transistor NT1 and the gate of the transistor PT4. In a case in which the transistor PT3 has the same size as the transistor PT1, the current I3 is the same as the current I1. The current supplied to the drain of the transistor NT1 is sufficiently greater than the current supplied to the gate of the transistor PT4.

The control voltage VLPF is supplied to the gate of the nMOS transistor NT1. The supplied control voltage VLPF makes a current I4 of "VLPF/R2" flow in the transistor NT1. Thus, a current I5 flowing in the transistor PT4, which is the result of "I4−I3", is a value "(VLPF/R2)−I1".

The pMOS transistors PT4 and PT5 constitute a current mirror circuit. Thus, a current I6 is set in accordance with the size ratio of the transistor PT5 to the transistor PT4 and is output from the drain of the transistor PT5 to the current-controlled oscillator 143. Assuming that the size ratio of the transistor PT5 to the transistor PT4 is represented by "N", the current I6, which is the result of "(I4−I3)×N", is a value "((VLPF/R2)−I1)×N".

In this case, a current IOUT supplied to the current-controlled oscillator 143, which is the result of "I2+I6" or "I1×N+((VLPF/R2)−I1)×N", is a value "(VLPF/R2)×N". That is, the above-described current IOUT is a value "(VLPF/R2)×N".

Thereafter, the current-controlled oscillator 143 outputs a clock signal CKO having a frequency corresponding to the current IOUT. As illustrated in FIG. 1, the current-controlled oscillator 143 supplies the clock signal CKO to the frequency division circuit 15. The frequency division circuit 15 divides the clock signal CKO and thereby outputs a clock signal CKD to the phase frequency comparator 11. The phase frequency comparator 11 compares the reference clock signal CKI and the clock signal CKD that is a result of division by the frequency division circuit 15, to detect a phase difference or a frequency difference. The phase frequency comparator 11 outputs the phase difference to the charge pump 12. The charge pump 12 supplies the control voltage VLPF corresponding to the phase difference to the current source and narrow-band filter 141. In this manner, the phase locked loop repeats detection of the phase difference between the reference clock signal CKI and the clock signal CKD and output of the clock signal CKO corresponding to the detected phase difference. This repetition is performed until there is no phase difference. As a result, the phase locked loop outputs a clock signal CKO having an intended frequency.

[1-3] Effects of First Embodiment

The first embodiment enables providing a voltage-controlled oscillator or a phase locked loop that outputs a stable clock signal.

Hereinafter, effects of the first embodiment are described in detail. In the first embodiment, noise of the current or voltage for supplying the fixed current I2 is reduced by using the narrow-band low-pass filter 1412. Also, noise of the current or voltage for supplying the current I6 is reduced by using the low-pass filter 1421. The narrow-band low-pass filter 1412 passes only a signal in a frequency band that is lower than the frequency band of the low-pass filter 1421. Thus, noise of a frequency higher than a frequency in the frequency band of the narrow-band low-pass filter 1412 is removed, and high frequency noise of the current IOUT is reduced. As a result, in accordance with the current IOUT, the current-controlled oscillator 143 outputs a clock having a stable frequency.

Figure 4:
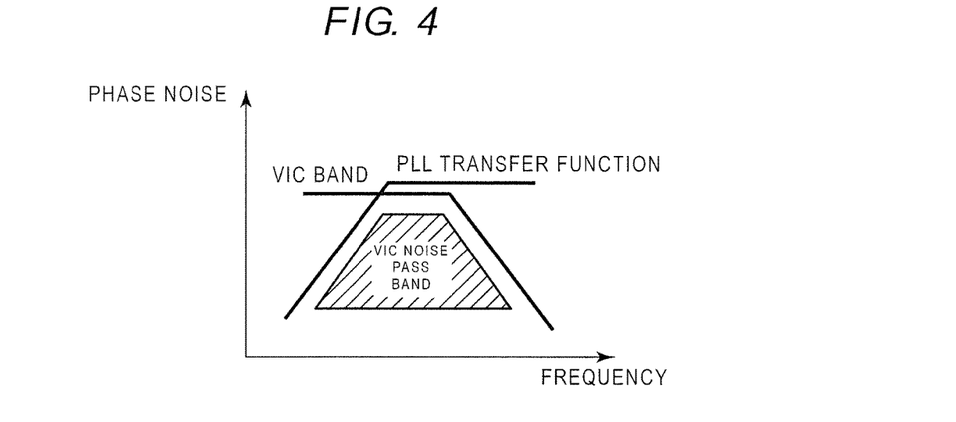
FIG. 4 is a diagram illustrating a relationship between frequency and phase noise of output current of a voltage-current converter of a comparative example.

FIG. 4 is a diagram illustrating a relationship between frequency and phase noise of output current of a voltage-current converter of a comparative example. In the comparative example, a filter is provided inside or at an output terminal of the voltage-current converter. Thus, as illustrated in FIG. 4, output current of this voltage-current converter has pass characteristics in a frequency band (VIC band) having a specific cutoff frequency, and therefore, noise of the output current is reduced.

However, to obtain loop stability of clock generation in the phase locked loop, the cutoff frequency of the output current of the voltage-current converter must be set sufficiently higher than the cutoff frequency (PLL transfer function) in the phase locked loop. For this reason, current noise cannot be reduced in a middle frequency band in which the pass bands of the phase locked loop and the voltage-current converter (PLL transfer function and VIC band) overlap. This middle frequency band corresponds to a VIC noise pass band.

Figure 5:
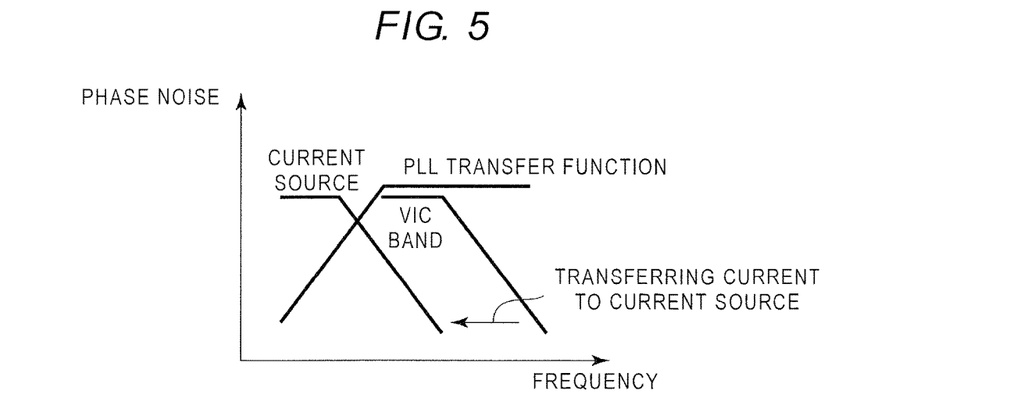
FIG. 5 is a diagram illustrating a relationship between frequency and phase noise of output current of the voltage-current converter of the first embodiment.

FIG. 5 is a diagram illustrating a relationship between frequency and phase noise of output current of the voltage-current converter 142 of the first embodiment. In the first embodiment, the current noise of the fixed current I2 corresponding to the current of the current source is reduced by using the narrow-band low-pass filter 1412. Since the fixed current I2 is not a current in the operative range of the PLL, reduction of the noise of the fixed current I2 by using the narrow-band low-pass filter 1412 causes no problem. On the other hand, since the current I6 is a current in the operative range of the PLL, the noise of the current I6 is removed by using the low-pass filter 1421 having the pass characteristics for passing current in a frequency band higher than the frequency band of the narrow-band low-pass filter 1412. Thus, while the VIC band pass characteristics are maintained, the pass frequency band for the fixed current is made lower, and the current noise of the current IOUT is reduced. As a result, in accordance with the current IOUT of which high frequency noise is reduced, the current-controlled oscillator 143 outputs a clock having a stable frequency.

[2] Second Embodiment

Next, a voltage-controlled oscillator of the second embodiment is described. In the first embodiment, the current I1 is set in accordance with the control voltage VLPF by using the voltage-current conversion circuit and hold circuit 1411. On the other hand, in the second embodiment, the current I1 is set by using a hold circuit, an analog-to-digital converter (ADC), and a current digital-to-analog converter (current DAC). The differences of the second embodiment from the first embodiment are mainly described herein.

[2-1] Configuration of Voltage-Controlled Oscillator

Figure 6:
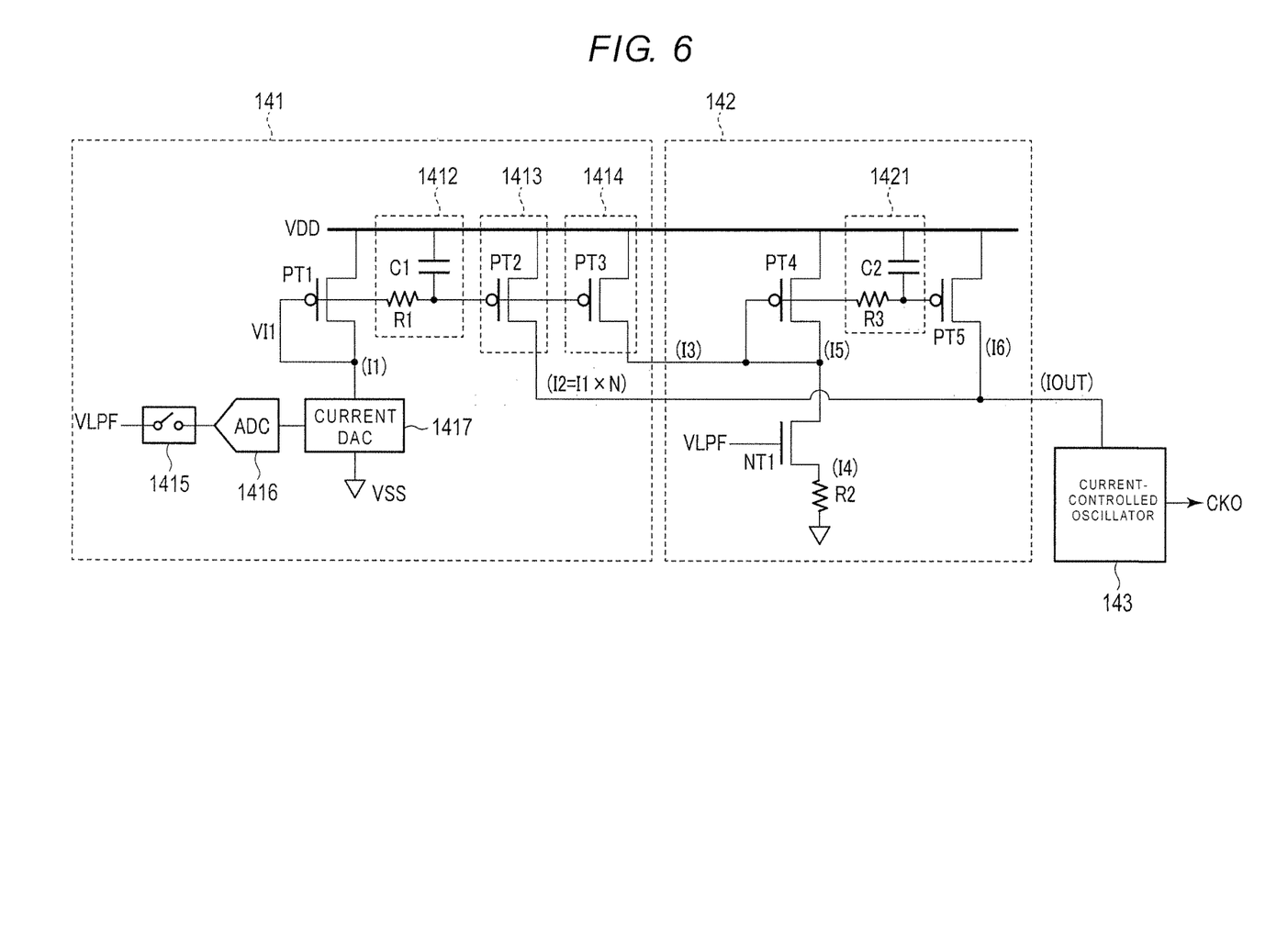
FIG. 6 is a circuit diagram illustrating a configuration of a voltage-controlled oscillator of a second embodiment.

FIG. 6 is a circuit diagram illustrating a configuration of the voltage-controlled oscillator of the second embodiment. The second embodiment includes a hold circuit 1415, an analog-to-digital converter (ADC) 1416, and a current digital-to-analog converter (current DAC) 1417, instead of the voltage-current conversion circuit and hold circuit 1411, in the current source and narrow-band filter 141 of the first embodiment.

The control voltage VLPF is supplied to an input terminal of the hold circuit 1415. An output terminal of the hold circuit 1415 is connected to an input terminal of the ADC 1416, and an output terminal of the ADC 1416 is connected to an input terminal of the current DAC 1417. The gate and drain of the transistor PT1 are connected to a current input terminal of the current DAC 1417, and the reference voltage terminal VSS is connected to a current output terminal of the current DAC 1417. The other components are similar to those in the first embodiment.

Figure 7:
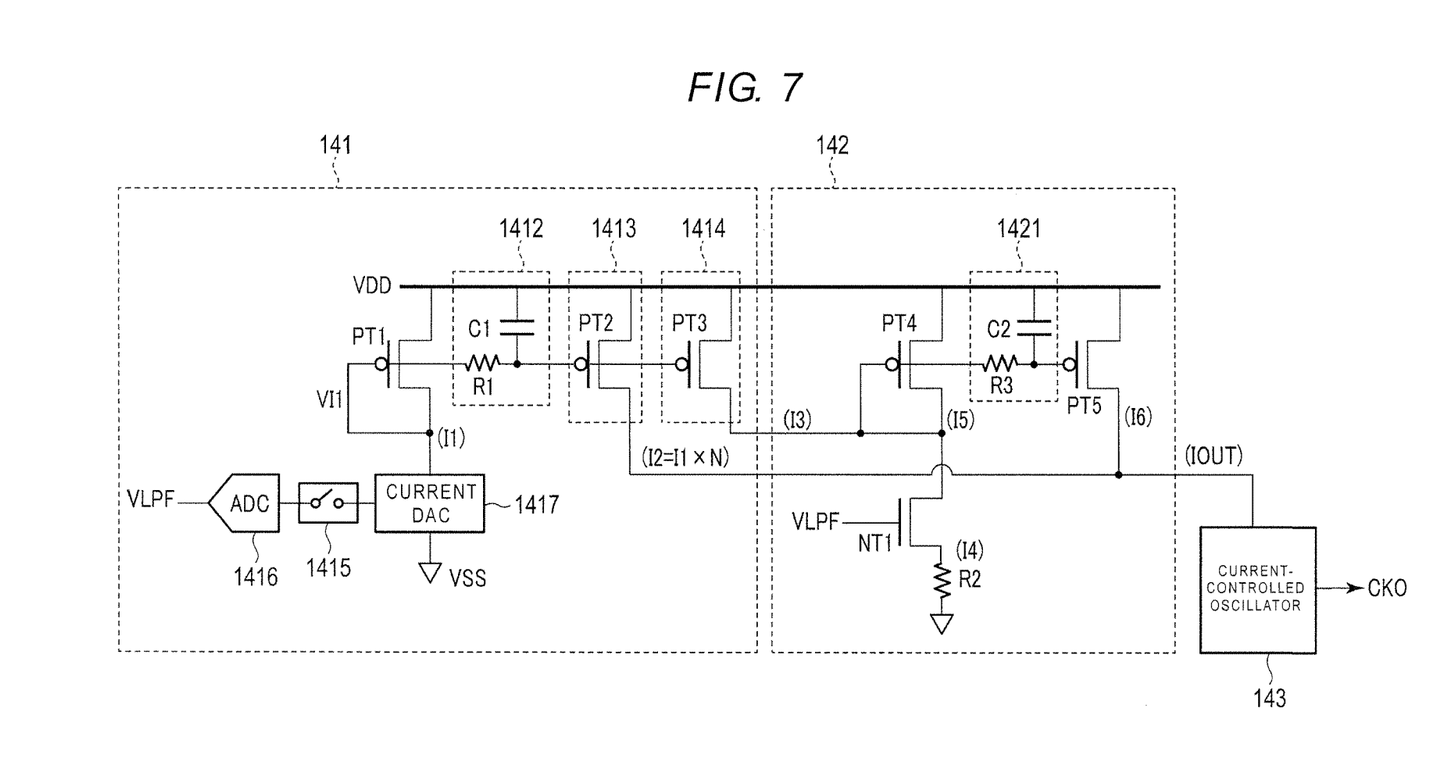
FIG. 7 is a circuit diagram illustrating a configuration of a voltage-controlled oscillator of a modification of the second embodiment.

Next, a voltage-controlled oscillator of a modification of the second embodiment is described with reference to FIG. 7. FIG. 7 is a circuit diagram illustrating a configuration of the voltage-controlled oscillator of the modification of the second embodiment.

In this modification, the hold circuit 1415 is provided between the ADC 1416 and the current DAC 1417. That is, the control voltage VLPF is supplied to the input terminal of the ADC 1416. The output terminal of the ADC 1416 is connected to the input terminal of the hold circuit 1415, and the output terminal of the hold circuit 1415 is connected to the input terminal of the current DAC 1417. The gate and drain of the transistor PT1 are connected to the current input terminal of the current DAC 1417, and the reference voltage terminal VSS is connected to the current output terminal of the current DAC 1417. The other components are similar to those in the first embodiment.

[2-2] Operation of Voltage-Controlled Oscillator

Operation of the second embodiment illustrated in FIG. 6 is as follows. The control voltage VLPF is supplied to the hold circuit 1415. The hold circuit 1415 holds the value of the control voltage VLPF and outputs the value to the ADC 1416. The ADC 1416 converts the received control voltage VLPF into a digital signal and outputs the resultant digital signal to the current DAC 1417. The current DAC 1417 converts the received digital signal into a current I1. Thus, the current I1 flows in the transistor PT1, and a voltage VI1 corresponding to the current I1 is supplied to each of the gates of the transistors PT1, PT2, and PT3. The rest of the operation is similar to that in the first embodiment.

Next, operation of the modification of the second embodiment illustrated in FIG. 7 is as follows. The control voltage VLPF is supplied to the ADC 1416. The ADC 1416 converts the value of the received control voltage VLPF into a digital signal and outputs the resultant digital signal to the hold circuit 1415. The hold circuit 1415 holds the received digital signal and outputs the digital signal to the current DAC 1417. The current DAC 1417 converts the received digital signal into a current I1. Thus, the current I1 flows in the transistor PT1, and a voltage VI1 corresponding to the current I1 is supplied to each of the gates of the transistors PT1, PT2, and PT3. The rest of the operation is similar to that in the first embodiment.

[2-3] Effects of Second Embodiment

The second embodiment and the modification thereof enable providing a voltage-controlled oscillator or a phase locked loop that outputs a stable clock signal, in a similar manner as in the first embodiment. The other effects are similar to those in the first embodiment.

[3] Third Embodiment

Next, a voltage-controlled oscillator of the third embodiment is described. In the third embodiment, the current I1 is set in accordance with the control voltage VLPF by using a hold circuit 1415 and a voltage-current conversion circuit. The differences of the third embodiment from the first embodiment are mainly described herein.

[3-1] Configuration of Voltage-Controlled Oscillator

Figure 8:
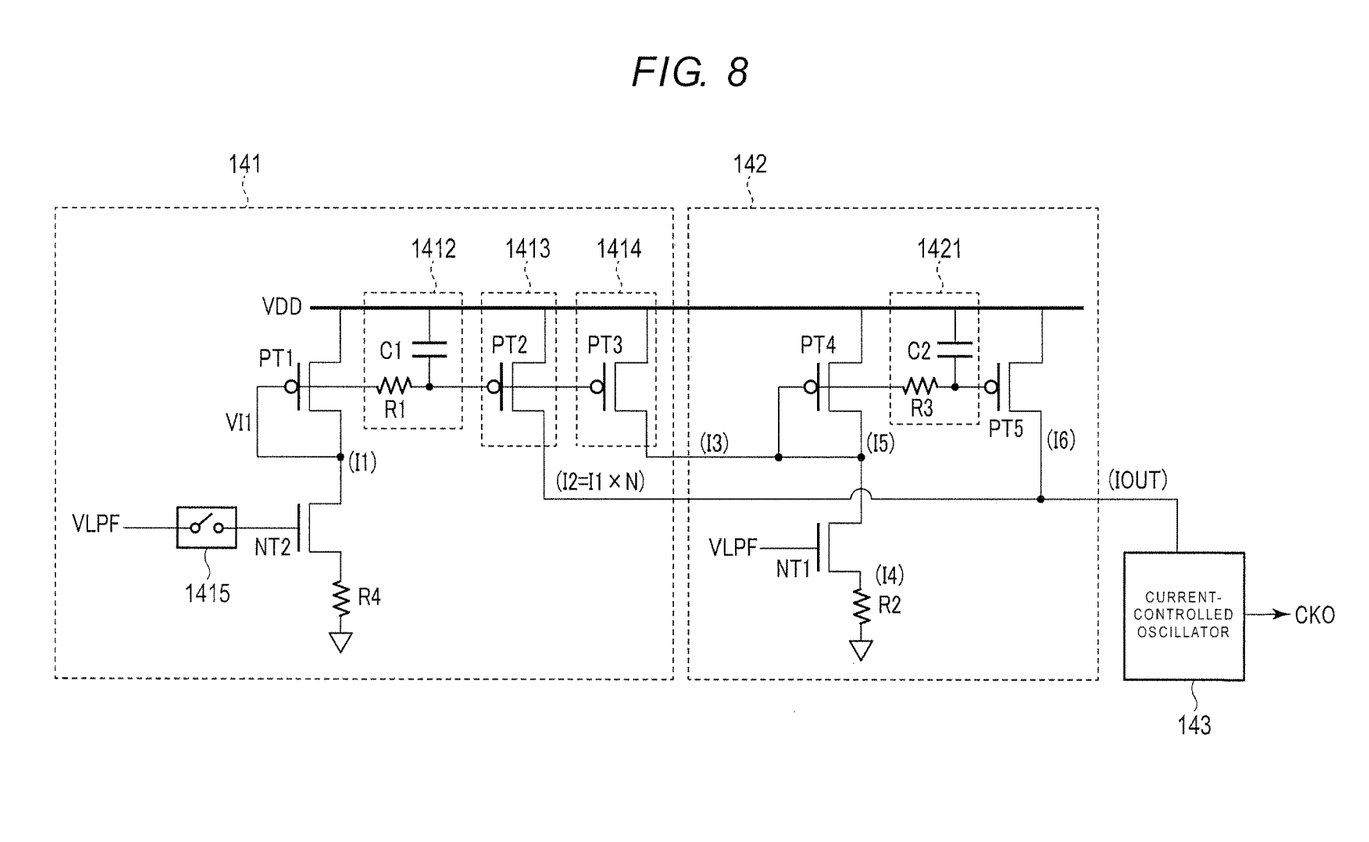
FIG. 8 is a circuit diagram illustrating a configuration of a voltage-controlled oscillator of a third embodiment.

FIG. 8 is a circuit diagram illustrating a configuration of the voltage-controlled oscillator of the third embodiment. The third embodiment includes a hold circuit 1415 and a voltage-current conversion circuit, instead of the voltage-current conversion circuit and hold circuit 1411, in the current source and narrow-band filter 141 of the first embodiment. The voltage-current conversion circuit has an nMOS transistor NT2 and a resistor R4.

The control voltage VLPF is supplied to an input terminal of the hold circuit 1415. An output terminal of the hold circuit 1415 is connected to a gate of the transistor NT2. A drain of the transistor NT2 is connected to the gate and drain of the transistor PT1. A source of the transistor NT2 is connected to the reference voltage terminal VSS via the resistor R4. The other components are similar to those in the first embodiment.

Figure 9:
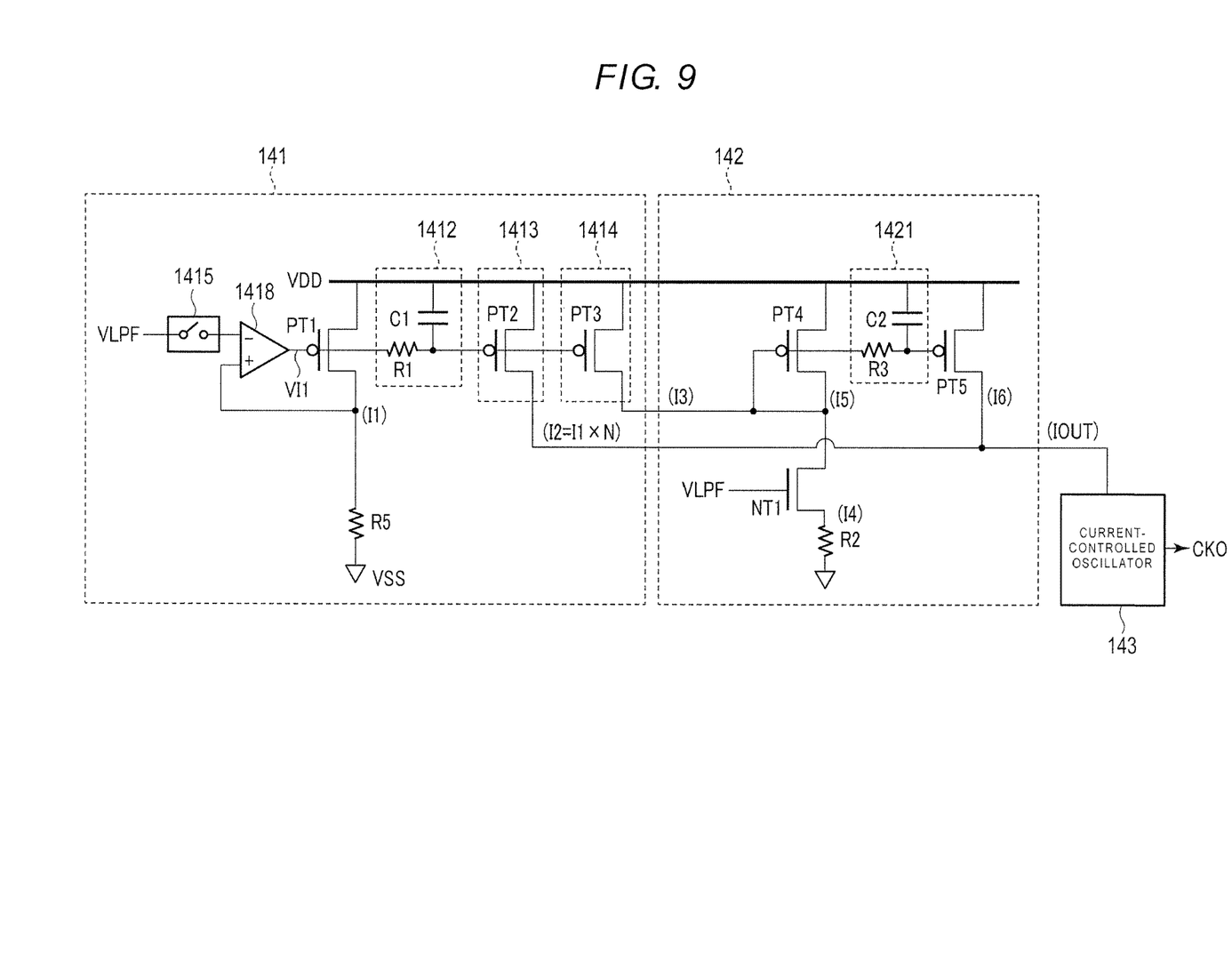
FIG. 9 is a circuit diagram illustrating a configuration of a voltage-controlled oscillator of a modification of the third embodiment.

Next, a voltage-controlled oscillator of a modification of the third embodiment is described with reference to FIG. 9. FIG. 9 is a circuit diagram illustrating a configuration of the voltage-controlled oscillator of the modification of the third embodiment.

This modification includes a voltage-current conversion circuit having an operational amplifier 1418, instead of the voltage-current conversion circuit having the transistor NT2 and the resistor R4.

The control voltage VLPF is supplied to the input terminal of the hold circuit 1415. The output terminal of the hold circuit 1415 is connected to an inverting input terminal (−) of the operational amplifier 1418. A non-inverting input terminal (+) of the operational amplifier 1418 is connected to the drain of the transistor PT1 and a terminal of the resistor R5. An output terminal of the operational amplifier 1418 is connected to each of the gates of the transistors PT1, PT2, and PT3. The other terminal of the resistor R5 is connected to the reference voltage terminal VSS. The other components are similar to those in the first embodiment.

[3-2] Operation of Voltage-Controlled Oscillator

Operation of the third embodiment illustrated in FIG. 8 is as follows. The control voltage VLPF is supplied to the hold circuit 1415. The hold circuit 1415 holds the value of the control voltage VLPF and outputs the value to the voltage-current conversion circuit. The voltage-current conversion circuit converts the control voltage VLPF into a current I1. That is, the control voltage VLPF is supplied to the gate of the transistor NT2. The transistor NT2 makes the current I1 flow in accordance with the control voltage VLPF supplied to the gate and in accordance with the resistor R4. Thus, the current I1 flows in the transistors PT1 and NT1, and a voltage VI1 corresponding to the current I1 is supplied to each of the gates of the transistors PT1, PT2, and PT3. The rest of the operation is similar to that in the first embodiment.

Next, operation of the modification of the third embodiment illustrated in FIG. 9 is as follows. The control voltage VLPF is supplied to the hold circuit 1415. The hold circuit 1415 holds the value of the control voltage VLPF and outputs the value to the inverting input terminal (−) of the operational amplifier 1418. The drain voltage of the transistor PT1 is supplied to the non-inverting input terminal (+) of the operational amplifier 1418.

The operational amplifier 1418 compares the control voltage VLPF that is supplied to the inverting input terminal (−) and the drain voltage that is supplied to the non-inverting input terminal (+) and outputs a voltage VI1 corresponding to the comparison result. The voltage VI1 drives the transistor PT1 and causes the drain voltage of the transistor PT1 to vary. This drain voltage is again supplied to the non-inverting input terminal (+), and the operational amplifier 1418 compares the control voltage VLPF and the drain voltage. In this manner, comparing the control voltage VLPF and the drain voltage, outputting the voltage VI1 corresponding to the comparison result, and varying the drain voltage of the transistor PT1, are repeated. This repetition is performed to determine a voltage VI1 by which the control voltage VLPF and the drain voltage have no difference therebetween. As a result, the voltage VI1 of which noise is removed is supplied to each of the gates of the transistors PT1, PT2, and PT3. The rest of the operation is similar to that in the first embodiment.

[3-3] Effects of Third Embodiment

The third embodiment and the modification thereof enable providing a voltage-controlled oscillator or a phase locked loop that outputs a stable clock signal, in a similar manner as in the first embodiment. The other effects are similar to those in the first embodiment.

[4] Other Modifications and Other Matters

The voltage-controlled oscillator of each of the above embodiments is not limited to the phase locked loop and may be used in various types of circuits having a voltage-controlled oscillator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage-controlled oscillator comprising:
   a current source that outputs a first current corresponding to a first voltage;
   a first circuit that outputs a second current corresponding to the first current;
   a second circuit that outputs a third current corresponding to the first current;
   a first filter that passes a current in a first frequency band to reduce noise of the second current;
   a voltage-current converter that outputs a sixth current corresponding to a fifth current which is obtained by subtracting the third current from a fourth current corresponding to the first voltage;
   a second filter that passes a current in a second frequency band to reduce noise of the sixth current, the second frequency band being different from the first frequency band;
   a current-controlled oscillator that oscillates a clock signal in accordance with a combined current of the second current and the sixth current.

2. The voltage-controlled oscillator according to claim 1, wherein the first frequency band is lower than the second frequency band.

3. The voltage-controlled oscillator according to claim 1, wherein the first filter passes a signal having a frequency lower than a first frequency in the first frequency band and cuts off a signal having a frequency at the first frequency or higher, the second filter passes a signal having a frequency lower than a second frequency in the second frequency band and cuts off a signal having a frequency at the second frequency or higher, and the second frequency is higher than the first frequency.

4. The voltage-controlled oscillator according to claim 1, wherein the first circuit has a first current mirror circuit, and the second circuit has a second current mirror circuit.

5. The voltage-controlled oscillator according to claim 4, wherein the first current mirror circuit has a first transistor to which the first current flows and has a second transistor to which the second current corresponding to the first current flows, and the second current mirror circuit has the first transistor and a third transistor to which the third current corresponding to the first current flows.

6. The voltage-controlled oscillator according to claim 1, wherein the current source has a voltage-current conversion circuit that converts the first voltage into the first current.

7. A voltage-controlled oscillator comprising:
   a current source that outputs a first current corresponding to a first voltage;
   a current addition circuit that outputs a second current corresponding to the first current;
   a current subtraction circuit that outputs a third current corresponding to the first current;
   a first filter that passes a current in a first frequency band to reduce noise of the second current;
   a voltage-current conversion circuit that converts the first voltage into a fourth current;
   a first circuit that outputs a sixth current corresponding to a fifth current which is obtained by subtracting the third current from the fourth current;
   a second filter that passes a current in a second frequency band to reduce noise of the sixth current, the second frequency band being different from the first frequency band;
   a current-controlled oscillator that outputs a first clock signal in accordance with a combined current of the second current and the sixth current.

8. The voltage-controlled oscillator according to claim 7, wherein the first frequency band is lower than the second frequency band.

9. The voltage-controlled oscillator according to claim 7, wherein the first filter passes a signal having a frequency lower than a first frequency in the first frequency band and cuts off a signal having a frequency at the first frequency or higher, the second filter passes a signal having a frequency lower than a second frequency in the second frequency band and cuts off a signal having a frequency at the second frequency or higher, and the second frequency is higher than the first frequency.

10. The voltage-controlled oscillator according to claim 7, wherein the current addition circuit has a first current mirror circuit, the current subtraction circuit has a second current mirror circuit, and the first circuit has a third current mirror circuit.

11. The voltage-controlled oscillator according to claim 10, wherein the first current mirror circuit has a first transistor to which the first current flows and has a second transistor to which the second current corresponding to the first current flows, the second current mirror circuit has the first transistor and a third transistor to which the third current corresponding to the first current flows, the voltage-current conversion circuit has a fourth transistor with a gate to which the first voltage is supplied, the third current mirror circuit has a fifth transistor to which the fifth current flows and has a sixth transistor to which the sixth current corresponding to the fifth current flows.

12. The voltage-controlled oscillator according to claim 7, wherein the current source has a voltage-current conversion circuit that converts the first voltage into the first current.

13. The voltage-controlled oscillator according to claim 12, wherein the current source further includes a hold circuit that holds the first current.

14. The voltage-controlled oscillator according to claim 12, wherein the current source further includes a hold circuit that holds the first voltage and outputs the first voltage to the voltage-current conversion circuit.

15. The voltage-controlled oscillator according to claim 7, wherein the current source has an analog-to-digital converter that converts the first voltage into a digital signal and has a digital-to-analog converter that converts the digital signal into the first current.

16. The voltage-controlled oscillator according to claim 15, wherein the current source further includes a hold circuit that holds the first voltage and outputs the first voltage to the analog-to-digital converter.

17. The voltage-controlled oscillator according to claim 15, wherein the current source further includes a hold circuit that holds the digital signal output from the analog-to-digital converter and that outputs the digital signal to the digital-to-analog converter.

18. The voltage-controlled oscillator according to claim 7, wherein the current source has an operational amplifier that has an inverting input terminal to which the first voltage is supplied and that has a non-inverting input terminal connected to a node to which the first current flows.

19. The voltage-controlled oscillator according to claim 18, wherein the current source further includes a hold circuit that holds the first voltage and outputs the first voltage to the operational amplifier.

20. A phase locked loop having the voltage-controlled oscillator according to claim 7, the voltage-controlled oscillator further comprising:
a frequency division circuit that divides the first clock signal and thereby outputs a second clock signal;
a comparison circuit that compares one or both of phase and frequency between the second clock signal and a third clock signal and outputs the comparison result; and
a charge pump that supplies the first voltage corresponding to the comparison result to the current source.

* * * * *